(12) United States Patent  
Brundage (10) Patent No.: US 6,331,117 B1
(45) Date of Patent: *Dec. 18, 2001

(54) ELECTRICAL COMPONENT SYSTEM WITH ROTATABLE ELECTRICAL CONTACTS

(76) Inventor: Gary L. Brundage, 6680 Alhambra Ave., #504, Concord, CA (US) 94553

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/092,313

(22) Filed: Jun. 5, 1998

(51) Int. Cl.$^7$ .................................................. H01R 39/00
(52) U.S. Cl. .............................. 439/21; 430/86; 430/91; 361/728; 361/733
(58) Field of Search ............................... 439/21, 161, 86, 439/91; 361/728, 733, 736, 744, 803

(56) References Cited

U.S. PATENT DOCUMENTS

| | | | |
|---|---|---|---|
| 3,038,138 | * 6/1962 | Peterson | 439/21 |
| 3,479,632 | * 11/1969 | Galles | 439/21 |
| 3,599,165 | 8/1971 | Wendell et al. | 439/164 |
| 3,972,577 | * 8/1976 | Charles et al. | 439/21 |
| 4,590,337 | 5/1986 | Engelmore | 179/186 |
| 4,904,190 | 2/1990 | Plocek et al. | 439/15 |
| 4,988,963 | * 1/1991 | Shirosaka et al. | 439/21 |
| 5,009,604 | 4/1991 | Plocek et al. | 439/15 |
| 5,350,308 | * 9/1994 | Laska et al. | 439/91 |
| 5,399,093 | * 3/1995 | Schneider et al. | 439/21 |
| 5,551,882 | * 9/1996 | Whiteman et al. | 439/21 |
| 5,588,843 | 12/1996 | Sobhani | 439/22 |
| 5,690,498 | 11/1997 | Sobhani | 439/22 |
| 5,704,792 | * 1/1998 | Sobhani | 439/21 |
| 5,746,606 | * 5/1998 | Sobhani | 439/21 |

OTHER PUBLICATIONS

Catalog entitled "Electronic Packaging Components, ZEBRA® Elastomeric Connectors, RFI/EMI Shielding & ESD Grounding, Thermal Management Components, and Custom Silicon Moldings, Extrusions," Fujipoly® (1996).

* cited by examiner

Primary Examiner—Paula Bradley
Assistant Examiner—Alexander Gilman
(74) Attorney, Agent, or Firm—Arthur J. Behiel (57) ABSTRACT

A rotatable electrical connector has a pair of wiring boards. Each wiring board supports two (or more) concentric conductors that have substantially smooth coplanar surfaces. The coplanar surfaces of the concentric conductors on each wiring board define a contact plane. To provide electrical contact between the two wiring boards, each wiring board is positioned perpendicular to an axis of rotation and is supported so that the respective contact planes of the first and second wiring boards are parallel. A resilient member, such as a spring, urges the wiring boards together to establish electrical contact between the respective surfaces of corresponding conductors on the two wiring boards. The above-described wiring boards are included in a circuit module that also includes a printed circuit board, or other electrical component, sandwiched between a pair of the wiring boards. The concentric conductors of the wiring boards face away from the electrical component so that the circuit modules can be assembled in series, much as batteries are assembled inside a flashlight, to create complex electrical systems.

39 Claims, 5 Drawing Sheets

ELECTRICAL COMPONENT SYSTEM WITH ROTATABLE ELECTRICAL CONTACTS

BACKGROUND

Rotary electrical connectors are used in a variety of applications where one part must mechanically rotate with respect to another part while retaining an electrical connection between the two. Where the required extent of rotation is small, typically less than one complete revolution, hard-wired electrical connections can be used. However, hard-wired connections can be difficult and expensive to make, especially where such connections must be made at remote locations or in confined spaces.

For larger required rotations, on the order of several revolutions, wraparound wire arrangements are available. In other instances, the connector must permit an arbitrarily large extent of rotation. In such a connector, electrical connection must be maintained, and the mode of connection cannot hinder the rotational movement. For these applications, the most common type of connector is a slip ring system. A plurality of slip rings in side-by-side arrangement extend along the length of a rotating shaft. Stationary brushes make contact to the individual slip rings. Unfortunately, such systems are typically expensive, due to the number of parts, and can be too bulky for some applications.

Some of the foregoing problems are addressed by Mohi Sobhani in his patent entitled "Rotary Electrical Connector," U.S. Pat. No. 5,588,843. That patent describes an electrical connector that includes two planar connector members positioned perpendicular to an axis of rotation and supported in rotational facing relation. One of the connector members has a set of concentric tracks, and the other has a corresponding set of protrusions positioned to contact the tracks. The two connector members are urged together by a spring so that the concentric tracts remain in electrical contact with the protrusions. A second patent to Sobhani, U.S. Pat. No. 5,690,498, entitled "Spring Loaded Rotary Connector," teaches a similar connector in which the protrusions are replaced with dimples. Both of the foregoing Sobhani patents are incorporated herein by reference.

The Sobhani connectors work well in many applications. However, the complexity of making the protrusions or dimples increases the cost of making the connectors. Further, such connectors can be sensitive to shock, which can damage the protrusions or dimples. There is therefore a need for a more robust and less expensive means of providing rotational electrical contact.

SUMMARY

The present invention is directed to a robust, inexpensive and rotatable electrical connector. In accordance with the invention, the connecter is used in conjunction with other parts to create a system of interconnected electrical components in which the individual components are easily removed for repair or to change the functionality of the system.

The inventive electrical connector includes a pair of wiring boards (e.g., printed-circuit boards) that each includes, on one side, two or more concentric conductors. The opposite sides of the two wiring boards include contacts that are electrically connected through the respective boards to the concentric conductors.

Each wiring board is held in place by a respective connector support. Contact is established between the two wiring boards when the supports are positioned so that the concentric conductors on the wiring boards face one another and are brought into electrical contact. This contact can be direct or through other components. For example, one embodiment includes a conductive elastomeric member between the wiring boards to allow some tolerance to ensure adequate conductive contact between opposing concentric conductors in the event that the wiring boards are not exactly parallel. In other embodiments, a spring or other elastic member urging one wiring board against the other supplies this tolerance.

The above-described wiring boards are used to advantage in a novel circuit module. The circuit module includes a printed circuit board, or other electrical component, sandwiched between a pair of wiring boards. The concentric conductors of the wiring boards face away from the electrical component so that the circuit module can be assembled in series with other modules much as batteries are assembled inside a flashlight. This simple configuration allows for easy assembly of systems that include circuit modules configured in accordance with the present invention, and further allows for easy substitution of modules within such systems.

BRIEF DESCRIPTION OF THE FIGURES

FIG. 4A is a top view of conductive member 400 that may be

FIG. 4B is a side view of conductive member 400 of FIG. 4A; disposed between a pair of wiring boards 100;

DETAILED DESCRIPTION

Figure 1A:
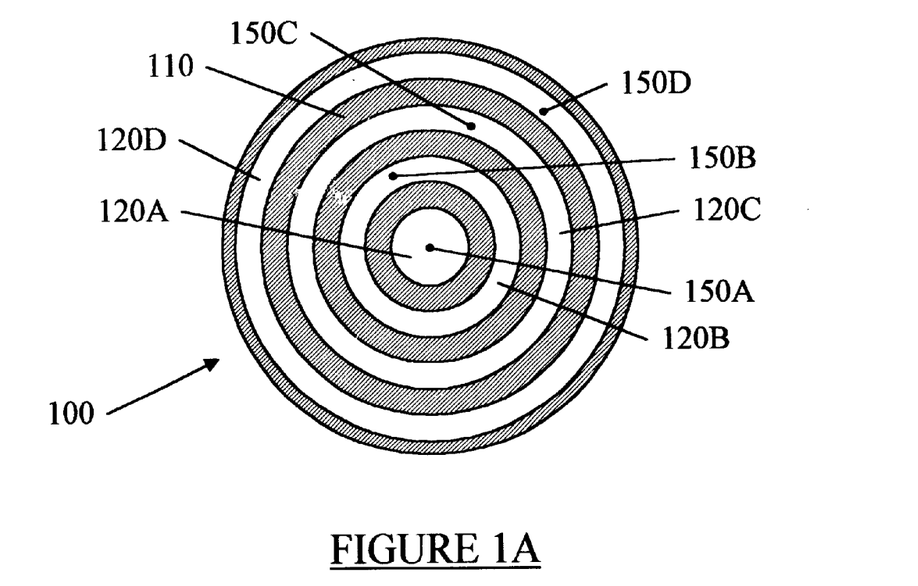
FIGS. 1A and 1B are plan views of a wiring board 100.
Figure 1B:
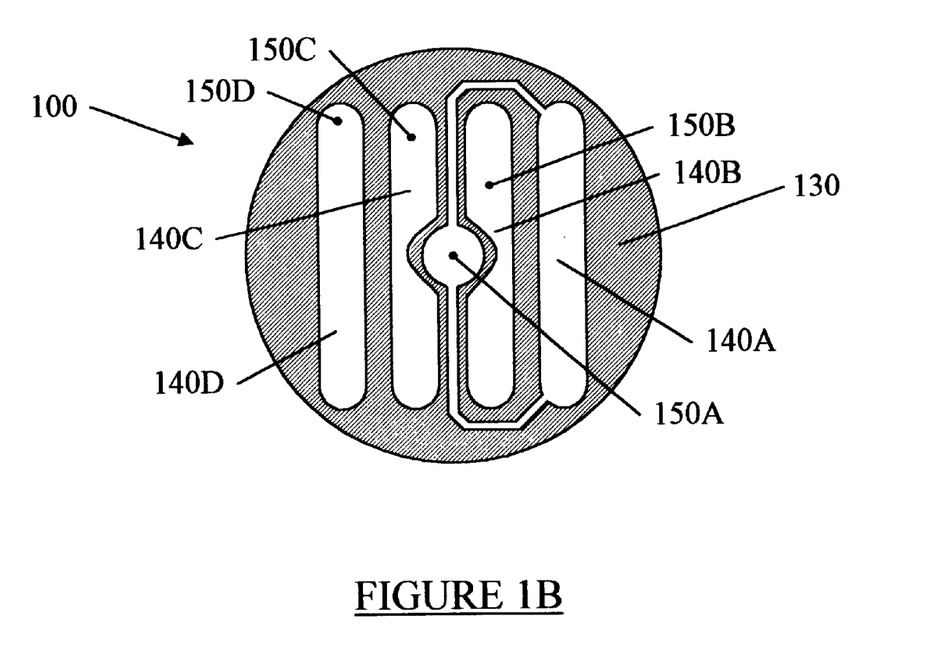

FIGS. 1A and 1B are plan views of a wiring board 100 configured in accordance with the present invention. FIG. 1A depicts a surface 110 of wiring board 100 that supports four concentric conductors 120A–D; FIG. 1B depicts the opposite surface 130 of wiring board 100, which supports four electrical contacts 140A–D. Finally, wiring board 100 includes four conductive elements 150A–D, each of which penetrates wiring board 100 to provide electrical contact between corresponding ones of conductive elements 120A–D and electrical contacts 140A–D.

Wiring board 100 can be formed by any of a number of conventional printed-circuit board manufacturing processes. However, wiring board 100 is not limited to printed-circuit boards. An example of a different but acceptable configuration is described in U.S. Pat. No. 4,590,337, to Engelmore, entitled "Rotatable Electrical Connector For Coiled Telephone Cords," which is incorporated herein by reference. In some embodiments electrical conductors 120A–D and electrical contacts 140A–D are gold plated to prevent oxidation and to reduce contact resistance.

Figure 2:
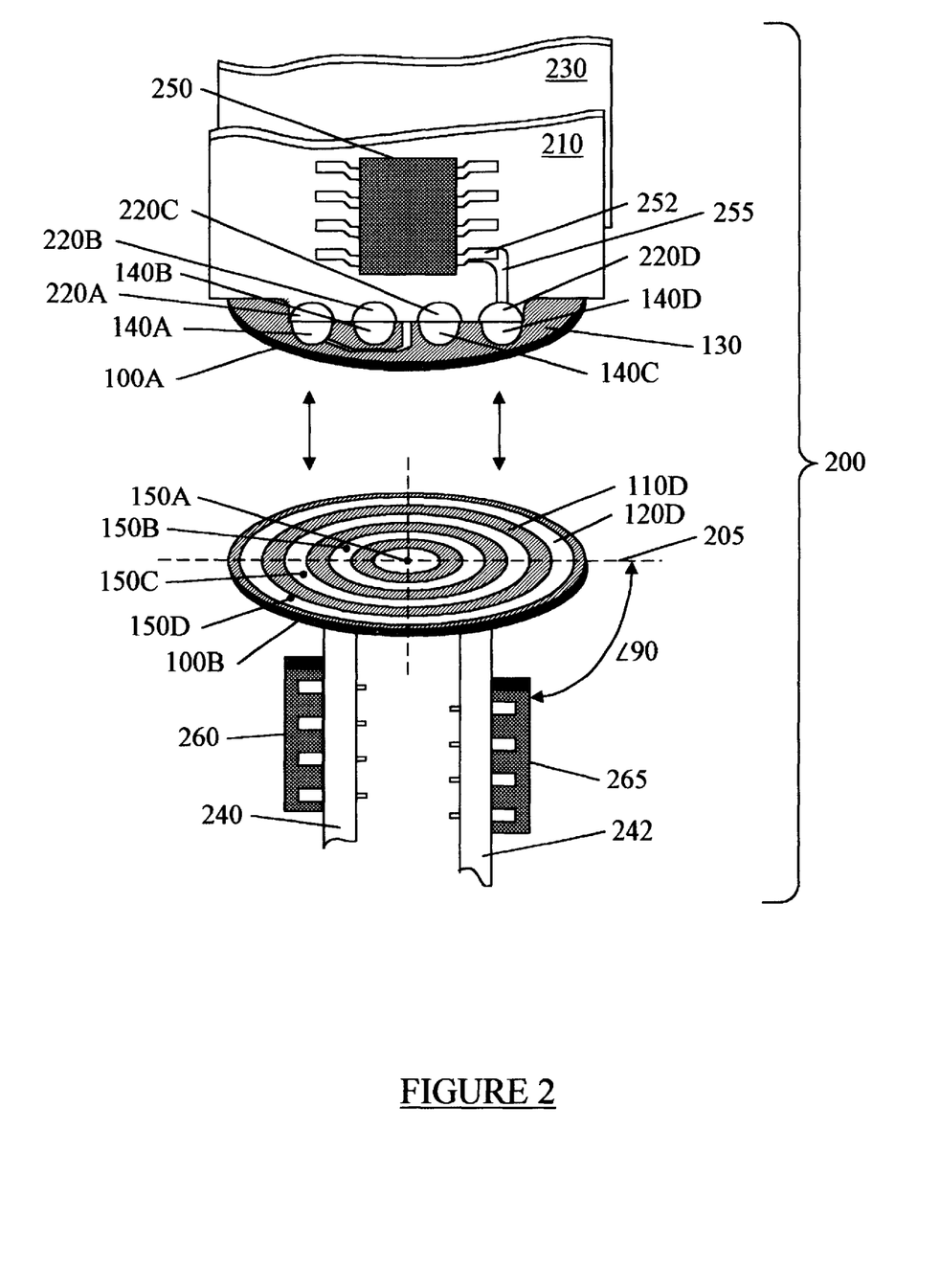
FIG. 2 depicts an electrical connector 200 in accordance with one embodiment of the present invention.

FIG. 2 depicts an electrical connector 200 in accordance with one embodiment of the present invention. Connector 200 includes a pair of wiring boards 100A and 100B. In the embodiment of FIG. 2, wiring boards 100A and 100B are identical to wiring board 100 of FIGS. 1A and 1B, like-numbered elements being the same. The surfaces of concentric conductors 120A–D of wiring board 100B form a contact plane 205 opposite a similar contact plane (not shown) defined by the concentric conductors of wiring board 100A. Wiring boards 100A and 100B need not be identical, but may be configured in any manner desired for a given application. Such adaptations are well within the skill of those in the art.

Wiring board 100A is solder-mounted to a connector support 210, a PC board in the depicted embodiment, via a number of edge-mounted pads 220A–D, each of which corresponds to a respective one of electrical contacts 140A–D. In the depicted embodiment, wiring board 100A is similarly mounted to a second connector support 230 positioned in parallel with connector support 210. Both connector supports 210 and 230 are substantially orthogonal to wiring board 100A.

Like wiring board 100A, wiring board 100B is solder-mounted to a pair of connector supports 240 and 242 via a number of edge-mounted pads (not shown). Also like wiring board 100A, connector supports 240 and 242 are each mounted orthogonally to wiring board 100B. The configuration of connector 200 provides physically robust connections between wiring boards 100A and 100B and their respective supports. These robust connections allow for significant compressive force between wiring boards 100A and 100B to ensure adequate electrical contact between respective concentric conductors. As discussed below in connection with FIG. 6, this configuration allows components, such as the PC boards that make up connector supports 210, 230, 240, 242, to be stacked end-to-end, much like batteries in a flashlight, to create relatively complex circuits with easily substituted individual components.

Soldering wiring boards 100A and 100B to their respective connector supports 240 and 242 provides robust, low-impedance electrical connections. However, other types of connections may be used. For example, wiring board 100A might be equipped with conventional conductive clips that mate with edge-mounted pads 220A–D. Many other connector configurations will be obvious to those of skill in the art.

Conductive elements 150A–D are typically through holes internally coated with metal. In one embodiment, center conductive element 150A is configured to receive a corresponding pin extending from the center of the opposite wiring board. This configuration ensures that the opposing wiring boards remain properly aligned along the same rotational axis. In another embodiment, a concentric screw in one wiring board mates with a threaded concentric hole in the opposite wiring board. In still other embodiments, components equipped with connectors configured in accordance with the invention can be threaded onto a concentric rod, much like beads on a string. The threaded components can then be urged against one another to ensure good electrical connections between them.

Connector support 210 includes a surface-mounted integrated circuit 250. For illustrative purposes, one leg 252 of circuit 250 is connected to pad 220D via a trace 255. In one embodiment, circuit 250 is a portion of a circuit component such as an amplifier; however, circuit 250 may be any of myriad conventional integrated circuits or components that may be used for selected applications. Connector supports 240 and 242 are shown to include respective integrated circuits 260 and 265 that are mounted using leads that extend through the respective circuit boards.

Figure 3:
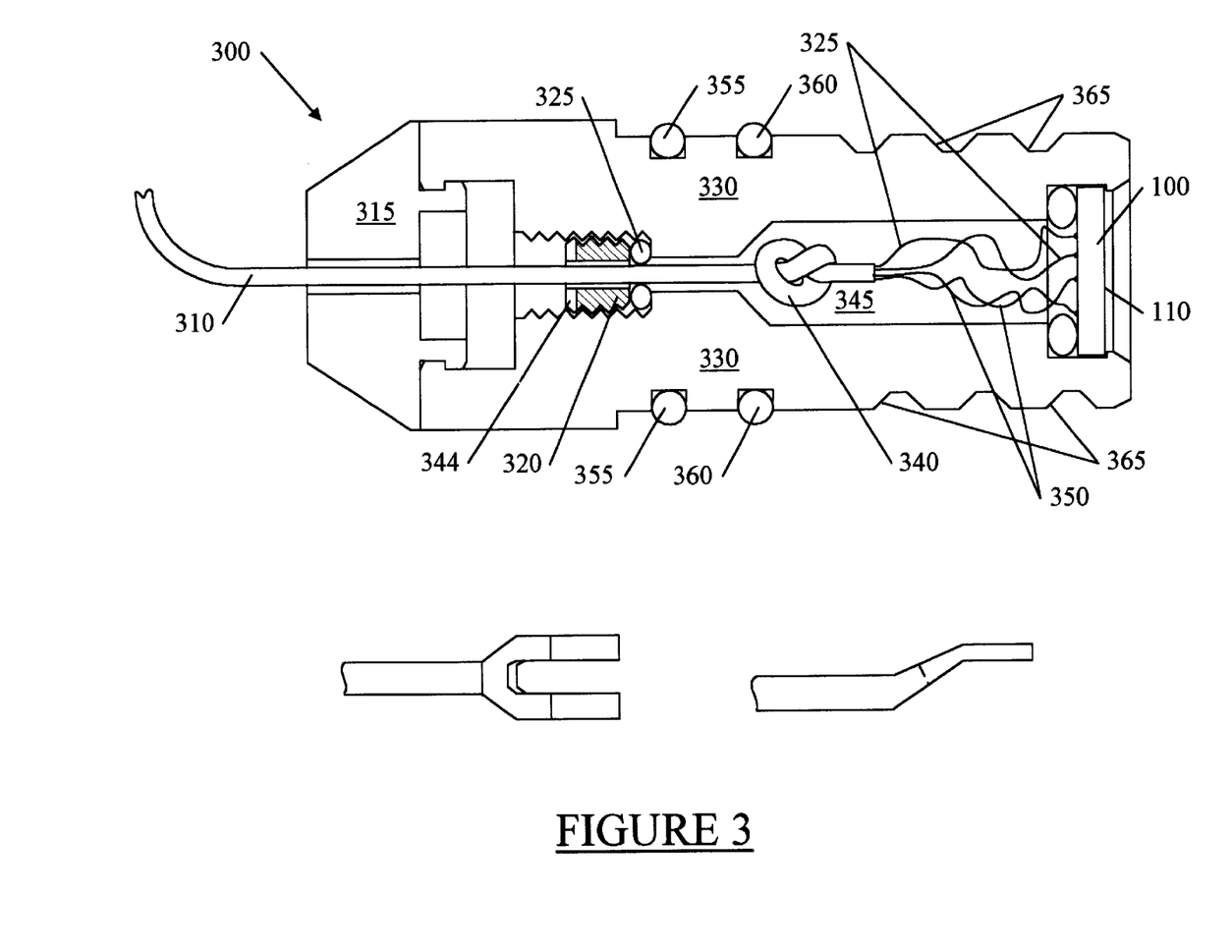
FIG. 3 depicts a connector support 300 in which a cable 310 is connected to wiring board 100 of FIG. 1.

FIG. 3 depicts a connector support 300 in which a cable 310 is connected to surface 130 (see FIG. 1) of wiring board 100. To assemble connector support 300, cable 310 is threaded through an end cap 315, a compression fitting 320, an 0-ring 325, a cable body 330, and a second 0-ring 335. The assembler then ties a knot 340 in cable 310 to secure an end of cable 310 within cable body 330. Next, the assembler should strip the outer insulation from cable 310 and then the individual insulation off of each of internal wires 350. Each of internal wires 350 is connected to a respective one of conductive elements 140A–D (See FIG. 1), and wiring board 100 is then snapped in place. Finally, cable 310 is then pulled tight against the necked-down portion of cable body 330 before tightening compression fitting 320 to compress 0-ring 325 around cable 310. A dedicated insertion tool 342, made by modifying a conventional screw driver as shown in FIG. 3, simplifies the process of inserting compression fitting 320. The end of insertion tool 342 mates with a slot 344 in the end of compression fitting 320, allowing the assembler to turn compression fitting 320 inside cable body 330. This action compresses 0-ring 325 between compression fitting 320 and the seat in cable body 330 to create a watertight seal.

A pair of 0-rings 355 and 360 provide a watertight seal between cable body 330 and a cylindrical housing that will be described in more detail in connection with FIG. 6. Threads 365 are provided on the outside of cable body 330 to mate with the cylindrical housing. In one embodiment, wiring board 100 includes a peripheral tab that mates with a slot (not shown) in cable body 330 to keep wiring board 100 from rotating inside cable body 330. Such rotation can also be avoided by employing a wiring board that is not round.

Figures 4, 4A, 4B:
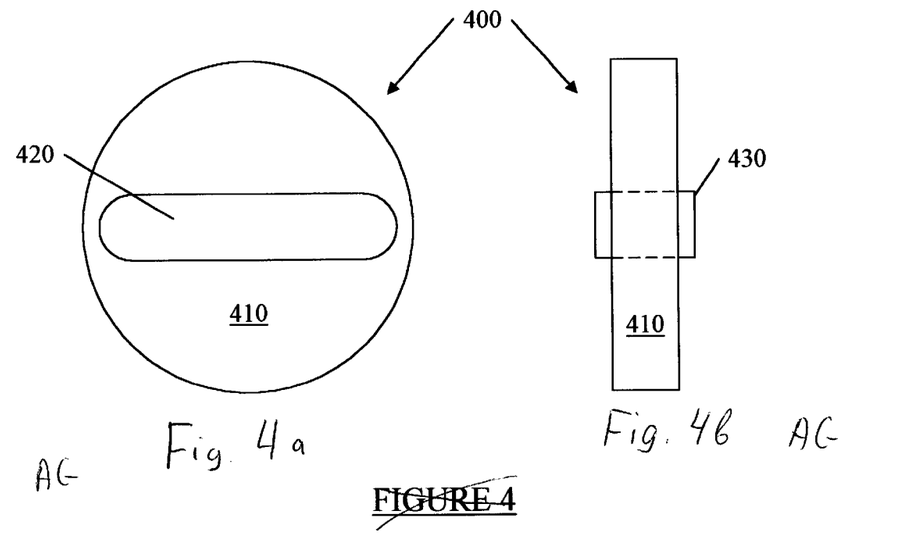

FIG. 4 is a top view of a conductive member 400 FIG. 4B is a side view of conductive member 400 of FIG. 4A. Referring to FIG. 2, conductive member 400 may be disposed between surface 110 of wiring board 110B and the opposing surface (not shown) of wiring board 100A. Conductive member 400 includes a dielectric retainer 410 with a slot 420. A piece of anisotropic elastomeric material 430 is pressed into slot 420. Material 430 conducts electricity in a direction perpendicular to the flat surfaces of retainer 410 but does not conduct electricity in a direction parallel to the long dimension of slot 420. Thus, material 430 provides electrical contact between opposite respective concentric conductors when sandwiched between of the contact planes wiring boards 100A and 100B Conductive member 400 is configured to maintain electrical contact between opposing surfaces of wiring boards 100A and 100B without shorting adjacent concentric conductors on either of wiring boards 100A and 100B. Elastomeric material suitable for use in conductive member 400 is available from Fujipoli of Cranford, N. J., under the trademark Zebra™.

Conductive member 400 advantageously provides a wiping action when wiring boards 100A and 100B are brought into rotational contact. In addition, the resilience of conductive material 430 creates some tolerance that ensures adequate conductive contact between wiring boards 100A and 100B in the event that wiring boards 100A and 100B are not exactly parallel. Conductive member 400 can be aligned with adjacent wiring boards by encompassing them in a common cylinder or by using a concentric pin, rod, or screw. These and other methods of maintaining the appropriate alignment can easily be implemented by those of skill in the art.

Figure 5:
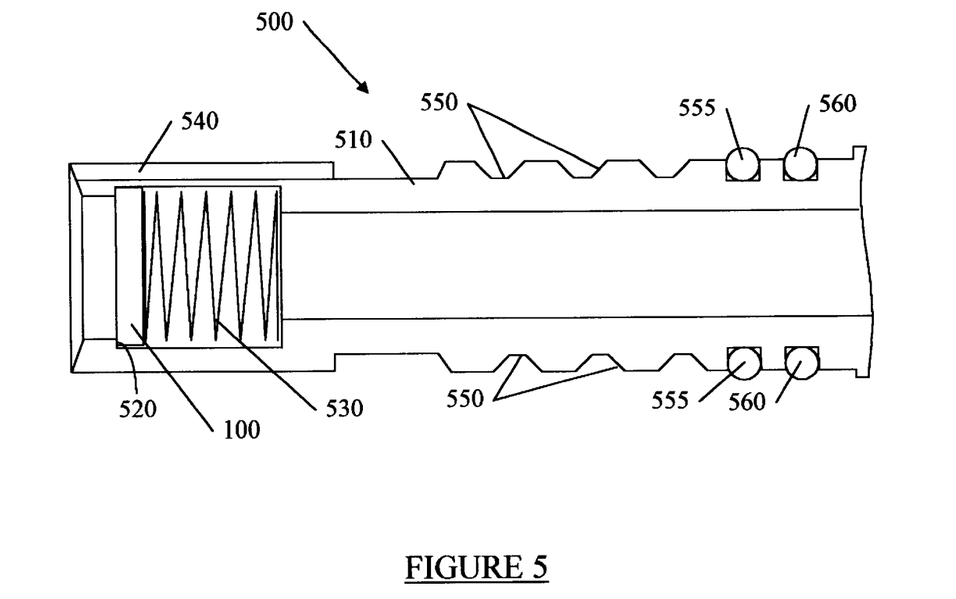
FIG. 5 is a cutaway view of a connector support 500.

FIG. 5 is a cutaway view of a connector support 500. In accordance with the invention, connector support 500 includes wiring board 100 as described above in connection with FIGS. 1A and 1B. Wiring board 100 is snapped into a connector body 510 and held in place by a lip 520. A spring 530 within connector body 510 urges wiring board 100 against lip 520. Wires or components (not shown) can be connected from within connector body 510 to conductive elements 140A–D of wiring board 100 (FIG. 1B). In one embodiment, wiring board 100 includes a peripheral tab that mates with a corresponding slot in connector body 510 to keep wiring board 100 from rotating inside connector body 510.

Connector body 510 also includes a slot 540 running parallel to the long dimension of connector body 510. This slot provides an avenue for a protrusion on the inside of a cylindrical housing that is slipped over connector body 510 during the assembly process. The protrusion mates with threads 550 to join the housing with connector support 500. A pair of 0-rings 555 and 560 provide a watertight seal between connector support 500 and the cylindrical housing, which will be described in detail in connection with FIG. 6.

Figure 6:
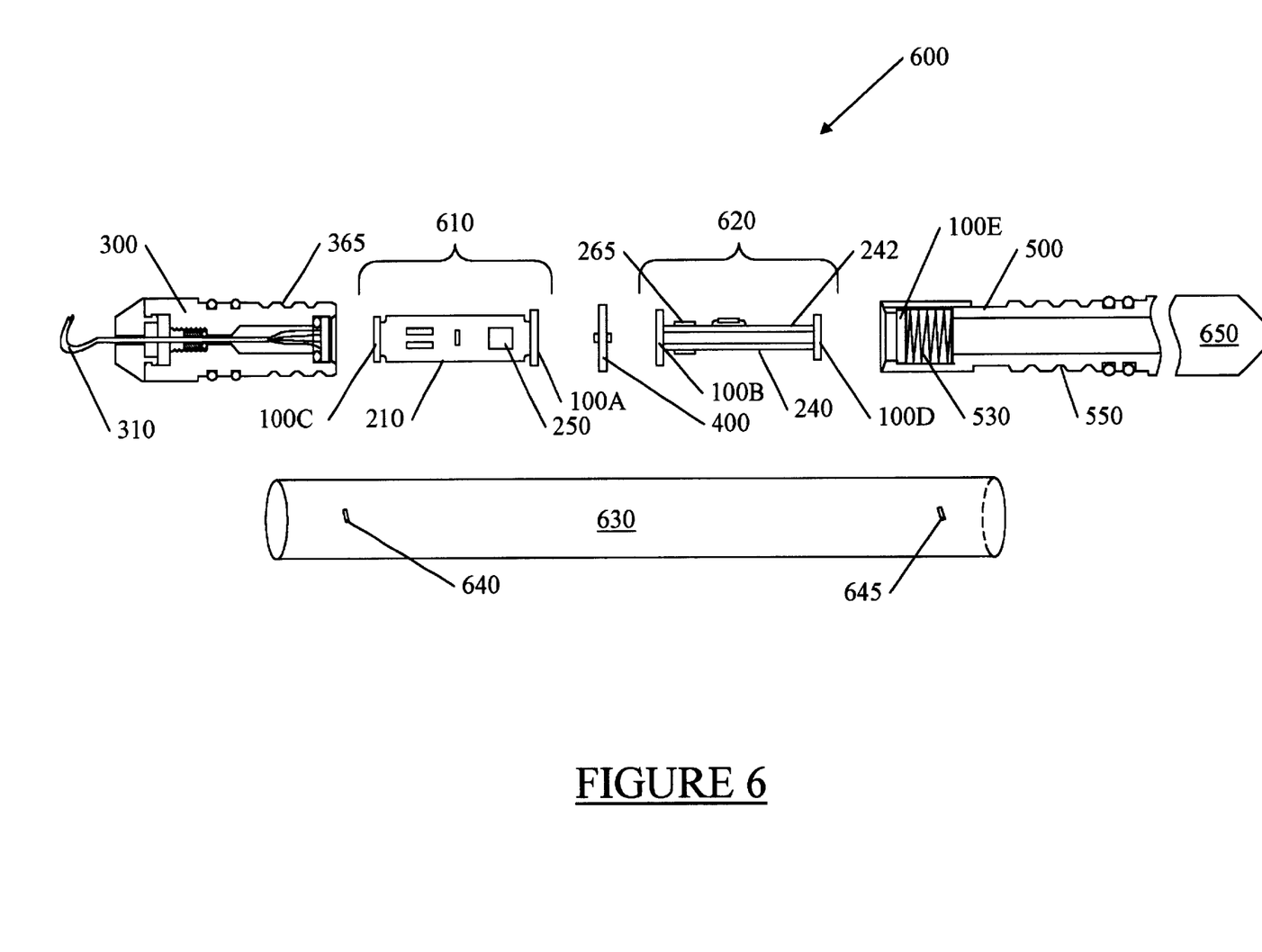
FIG. 6 is an exploded view of a system 600 configured in accordance with the present invention.

FIG. 6 is an exploded view of a system 600 configured in accordance with the present invention. System 600 includes a pair of circuit modules 610 and 620 disposed between connector supports 300 and 500 of FIGS. 3 and 5, respectively. Conductive member 400 is disposed between wiring boards 100A and 100B of respective circuit modules 610 and 620. System 600 is completed when a component housing 630, typically a stainless-steel tube, is threaded onto each of connector supports 300 and 500. A pair of dimples 640 and 645, pressed into the side of component housing 630, create corresponding protrusions on the inside surface of component housing 630. These protrusions mate with threads 550 and 365 to secure connector supports 300 and 500 to component housing 630.

Once system 600 is assembled, spring 530 exerts a compressive force on the stack of circuit components that includes circuit modules 610 and 620 and conductive member 400. This compressive force ensures excellent electrical contact between opposing wiring boards. Moreover, the radial symmetry of the concentric conductors on the respective wiring boards allows system 600 to be assembled using screw-type couplings, although other types of couplings may also be used. The various wiring boards remain stationary with respect to one another under normal operating conditions.

Each circuit module 610 and 620 can be virtually any type of electrical circuit. For example, circuit module 610 might be a preamplifier and circuit module 620 an analog-to-digital converter. Being arranged as they are, components 610 and 620 can be removed and replaced as easily as batteries in a flashlight. Moreover, component housing 630 can be substituted with a longer or shorter housing to accommodate more or fewer electrical components or to accommodate components of different sizes. Dummy components can be inserted to allow room for future additions. For example, a particular system may be adapted for use where no power supply is readily available by substituting a dummy component with a battery pack configured with connectors in accordance with the present invention.

System 600 can support a number of applications. In the embodiment of FIG. 6, System 600 includes a sensor 650 that may be attached to connector support 500 using any conventional connection method suitable for a given application. Sensor 600 may be, for example, an ion sensor for monitoring ground water, a thermometer, a microphone, a video camera, or any of a variety of other conventional transducers. In one embodiment, sensor 650 is a pH sensor for monitoring groundwater acidity or alkalinity, circuit module 620 is a differential amplifier configured to amplify an output signal from sensor 650, and circuit module 610 is a transmitter that accepts signals from the amplifier and transmits those signals through cable 310.

The order and orientation of the various modules can be critical to system function and to avoid damage. Some systems may therefore include modules that can only be installed in a particular orientation, thus ensuring that the systems cannot be assembled improperly. In one embodiment, for example, the wiring board 100D of system 600 is smaller in diameter than wiring board 100B so that circuit module 620 cannot contact wiring board 100E should circuit module 620 be installed backwards. Other keying methods will be readily apparent to those of skill in the art.

The types of connections illustrated in FIG. 6 are illustrative and not limiting. For example, while only one conductive member 400 is shown, each pair of opposing wiring boards may be provided with some form of conductive member, or with no conductive member. Further, unless otherwise specified, each of the elements described in the foregoing Figures can be made from various materials and by various methods. For Example, end cap 315, cable body 330, and connector body 510 can be machined from a plastic, such as Delrin™. The selections of materials and manufacturing techniques, dictated chiefly by particular applications and economic considerations, are well within the ability of those of skill in the art.

While the present invention has been described in connection with specific embodiments, variations of these embodiments will be obvious to those of ordinary skill in the art. For example, 1. system 600 is not limited to sensor applications;
2. wiring board 100 may include a greater or lesser number of concentric conductors;
3. circuit modules, such as circuit modules 610 and 620, can be made to snap together and to other modules and supports; and
4. connector support 300 may be used in conjunction with another similar connector body with or without intermediate electrical components.

Still other variations will be readily apparent to those of skill in the art. Therefore, the spirit and scope of the appended claims should not be limited to the foregoing description.

What is claimed is:

1. A rotatable electrical connector comprising:
   a. a connector support;
   b. a wiring board connected to the connector support, the wiring board supporting first and second concentric conductors, wherein the first and second concentric conductors include substantially smooth coplanar surfaces that define a first contact plane;
   c. third and fourth conductors including substantially smooth coplanar surfaces that define a second contact plane; and
   d. a conductive member disposed between the first and second contact planes, the conductive member configured to maintain electrical contact between the respective surfaces of the first and third conductors and between the respective surfaces of the second and fourth conductors, the conductive member including:
      i. a dielectric retainer; and
      ii. at least one elastomeric conductor extending through the dielectric retainer;
   e. wherein the connector support and the dielectric retainer are positioned to maintain the first and second contact planes substantially in parallel and separated by the at least one elastomeric conductor to establish the electrical contact via the at least one elastomeric conductor between the respective surfaces of the first and third conductors and between the respective surfaces of the second and fourth conductors.

2. The electrical connector of claim 1, further comprising a resilient member disposed against the first wiring board, the resilient member configured to urge the first and second conductors toward the third and fourth conductors, thereby compressing the at least one elastomeric conductor.

3. The electrical connector of claim 2, wherein the resilient member comprises a spring.

4. The electrical connector of claim 1, wherein the third and fourth conductors are concentric.

5. An electrical connector comprising:
   a. first and second connector supports;
   b. a first wiring board connected to the first connector support, the first wiring board supporting first and second concentric conductors, wherein the first and second concentric conductors include substantially smooth concentric coplanar surfaces that define a first contact plane; and
   c. a second wiring board connected to the second connector support, the second wiring board supporting third and fourth concentric conductors, wherein the third and fourth concentric conductors include substantially smooth concentric coplanar surfaces that define a second contact plane:
   d. wherein the first and second connector supports are configured to maintain the first and second contact planes in parallel to establish electrical contact between the respective concentric coplanar surfaces of the first and third conductors and between the respective concentric coplanar surfaces of the second and fourth conductors; and
   e. wherein the first connector support comprises a circuit board.

6. The electrical connector of claim 5, wherein the circuit board defines a plane substantially orthogonal to the first contact plane.

7. The electrical connector of claim 6, further comprising a second circuit board positioned substantially orthogonal to the first contact plane.

8. A circuit module comprising:
   a. a circuit board including circuit components and having first and second edges;
   b. a wiring board connected to the first edge of the circuit board, the wiring board including first and second concentric conductors in electrical contact with the components;
   c. wherein the first and second conductors include substantially smooth planar surfaces, the surfaces being orthogonal to the plane; and
   d. a second wiring board connected to the second edge, the second wiring board including third and fourth concentric conductors in electrical contact with the components.

9. A circuit module comprising:
   a. a printed-circuit board defining a plane, the printed circuit board having components mounted thereon and having an edge; and
   b. a wiring board connected to the edge of the printed-circuit board, the wiring board including first and second concentric conductors in electrical contact with the components;
   c. wherein the first and second conductors include substantially smooth planar surfaces, the surfaces being orthogonal to the plane.

10. The circuit module of claim 9, further comprising a second printed-circuit board having a second edge connected to the wiring board, wherein the second printed-circuit board is arranged orthogonal to the planar surfaces of the first and second conductors.

11. A system comprising:
   a. a first electrical connector including:
      i. a first connector support;
      ii. a first wiring board connected to the first connector support, the first wiring board supporting first and second concentric conductors; and
      iii. a second wiring board supporting third and fourth concentric conductors;
   b. a printed-circuit board defining a plane, the printed circuit board having components mounted thereon and having a first edge connected to the second wiring board and a second edge;
   c. a second electrical connector including:
      i. a second connector support;
      ii. a third wiring board connected to the second connector support, the third wiring board supporting fifth and sixth concentric conductors; and
      iii. a fourth wiring board supporting seventh and eighth concentric conductors; and
   d. a housing having a first end connected to the first connector support and a second end connected to the second connector support, the housing enclosing the printed circuit board and configured to urge the first and fourth wiring boards toward one another.

12. The system of claim 11, further comprising a conductive member disposed between the first and second wiring boards, the conductive member configured to maintain electrical contact between the respective surfaces of the first and third conductors and between the respective surfaces of the second and fourth conductors.

13. The system of claim 11, wherein the first and second conductors include substantially smooth coplanar surfaces that define a first contact plane, and wherein the third and fourth conductors include substantially smooth coplanar surfaces that define a second contact plane parallel to the first contact plane.

14. An electrical rotary connector comprising:
   a. first and second connector supports;
   b. a first wiring board connected to the first connector support, the first wiring board supporting first and second concentric conductors;
      i. wherein the first concentric conductor includes a first substantially smooth surface that defines a first contact area; and
      ii. wherein the second concentric conductor includes a second substantially smooth surface that defines a second contact area; and
   c. a second wiring board connected to the second connector support, the second wiring board supporting third and fourth concentric conductors;
      i. wherein the third concentric conductor includes a third substantially smooth surface that defines a third contact area; and
      ii. wherein the fourth concentric conductor includes a fourth substantially smooth surface that defines a fourth contact area; and
   d. a conductive member disposed between the first and second wiring boards, the conductive member configured to maintain electrical contact between the respective surfaces of the first and third concentric conductors and between the respective surfaces of the second and fourth concentric conductors;

e. wherein the first and second connector supports are configured to maintain the first and second wiring boards in parallel to establish electrical contact between the first and third contact areas and the second and fourth contact areas; and f. wherein the first contact area equals the third contact area and the second contact area equals the fourth contact area.

15. The electrical connector of claim 14, wherein the first contact area differs from the second contact area.

16. A sensor system comprising:
    a. a cylindrical housing having a first end and a threaded second end;
    b. a sensor proximate to the first end of the housing;
    c. a circuit component disposed within the housing and in electrical communication with the sensor, the circuit component including:
        i. first and second conductive pads; and
        ii. an integrated circuit;
    d. an electrical connector including:
        i. a threaded connector support rotatable attached to the threaded second end of the housing and having a channel adapted to receive a cable, wherein the cable includes first and second insulated wires;
        ii. a wiring board attached to the connector support, the wiring board supporting first and second concentric conductors electrically connected to respective ones of the first and second insulated wires; and
        iii. at least one resilient conductive member disposed against the first and second concentric conductors, the at least one resilient conductive member adapted to provide electrical contact between the first conductive pad and the first conductor and to provide electrical contact between the second conductive pad and the second conductor; and
        iv. a second resilient member adapted to urge the wiring board toward the first and second conductive pads to compress the at least one resilient conductive member.

17. The system of claim 16, further comprising a retainer adapted to maintain the at least one resilient conductive member in place within the housing and against the first and second concentric conductors.

18. The system of claim 16, further comprising a second wiring board connected to the first and second conductive pads and disposed against the at least one resilient conductive member.

19. The system of claim 18, wherein the second wiring board includes concentric conductors.

20. A sensor system comprising:
    a. a cylindrical housing having first and second ends;
    b. a sensor proximate to the first end of the housing;
    c. a circuit component disposed within the housing and in electrical communication with the sensor, the circuit component including first and second conductive pads; and
    d. an electrical connector including:
        i. a connector support attached to the second end of the housing;
        ii. a wiring board attached to the connector support, the wiring board supporting first and second concentric conductors; and
        iii. at least one resilient conductive member disposed against the first and second concentric conductors, the at least one resilient conductive member adapted to provide electrical contact between the first conductive pad and the first conductor and to provide electrical contact between the second conductive pad and the second conductor;
    e. wherein the connector support includes threads configured to rotatably mate with the housing.

21. The system of claim 20, wherein the wiring board is fixed to the connector support such that the wiring board rotates with the connector support.

22. The system of claim 20, further comprising a cable including first and second wires electrically connected to the respective first and second concentric conductors on the wiring board.

23. The system of claim 22, further comprising a fitting securing the cable to the connector support.

24. A sensor system comprising:
    a. a cylindrical housing having first and second ends;
    b. a sensor proximate to the first end of the housing;
    c. a circuit component disposed within the housing and in electrical communication with the sensor, the circuit component including first and second conductive pads; and
    d. an electrical connector including:
        i. a connector support attached to the second end of the housing;
        ii. a wiring board attached to the connector support, the wiring board supporting first and second concentric conductors; and
        iii. at least one resilient conductive member disposed against the first and second concentric conductors, the at least one resilient conductive member adapted to provide electrical contact between the first conductive pad and the first conductor and to provide electrical contact between the second conductive pad and the second conductor; and
    e. a retainer adapted to maintain the at least one resilient conductive member in place within the housing and against the first and second concentric conductors;
    f. wherein the retainer includes a slot adapted to receive the at least one resilient conductive member.

25. A sensor system comprising:
    a. a cylindrical housing having first and second ends;
    b. a sensor proximate to the first end of the housing;
    c. a circuit component disposed within the housing and in electrical communication with the sensor, the circuit component including first and second conductive pads; and
    d. an electrical connector including:
        i. a connector support attached to the second end of the housing;
        ii. a wiring board attached to the connector support, the wiring board supporting first and second concentric conductors; and
        iii. at least one resilient conductive member disposed against the first and second concentric conductors, the at least one resilient conductive member adapted to provide electrical contact between the first conductive pad and the first conductor and to provide electrical contact between the second conductive pad and the second conductor; and
    e. a retainer adapted to maintain the at least one resilient conductive member in place within the housing and against the first and second concentric conductors;

f. wherein the retainer is substantially circular.

26. The system of claim 25, wherein the at least one conductive member is a section of elastomeric conductor.

27. A rotatable connector system adapted to provide electrical contact between a cable and a circuit component enclosed within a housing, the rotatable connector comprising:
   a. a cylindrical connector support adapted to mate with the housing and having a channel adapted to receive the cable;
   b. a fitting adapted to secure the cable within the connector support;
   c. a wiring board attached to the connector support and supporting first and second concentric conductors;
   d. at least one elastomeric conductive member disposed against the first and second concentric conductors; and
   e. a retainer adapted to maintain the at least one elastomeric conductive member in place against the first and second concentric conductors.

28. The connector system of claim 27, wherein the connector support comprises threads to rotatably connect the support to the housing.

29. The connector system of claim 27, wherein at least one of the housing and the connector support includes an 0-ring adapted to create a watertight seal between the connector support and the housing.

30. The connector system of claim 27, further comprising a spring located within the housing and adapted to urge the resilient conductive member against the first and second concentric conductors supported by the wiring board.

31. The connector system of claim 27, wherein the housing is cylindrical.

32. A sensor system comprising:
   a. a housing having first and second housing ends;
   b. a sensor proximate to the first housing end;
   c. a connector support attached to the second housing end and including a channel adapted to receive a cable, the cable including first and second insulated wires;
   d. a rotatable electrical connector including:
      i. a first pair of conductors electrically connected to respective ones of the first and second insulated wires;
      ii. elastomeric material disposed against the first pair of conductors; and
      iii. a second pair of conductors disposed against the elastomeric material and electrically connected to respective ones of the first and second insulated wires via the elastomeric material; and
   e. a circuit module within the housing between the sensor and the connector and adapted to communicate signals between sensor and at least one of the insulated wires via the connector, the circuit module including:
      i. a conductive pad electrically connected to one of the first and second insulating wires via the one of the first pair of conductors, one of the second pair of conductors, and the elastomeric material; and
      ii. an integrated circuit connected to the conductive pad.

33. The sensor system of claim 32, wherein at least one of the first and second pairs of conductors are concentric.

34. The sensor system of claim 32, wherein the connector support includes threads configured to rotatably mate with the housing.

35. The sensor system of claim 32, wherein at least one of the housing and the connector support includes an O-ring adapted to create a watertight seal between the connector support and the housing.

36. The sensor system of claim 32, wherein the circuit module comprises an amplifier.

37. The sensor system of claim 32, wherein the circuit module comprises an analog-to-digital converter.

38. The sensor system of claim 32, wherein the circuit module further includes a second conductive pad electrically connected to a second one of the first and second insulating wires via a second one of the first pair of conductors, a second one of the second pair of conductors, and the elastomeric material.

39. The system of claim 32, wherein the circuit module further comprising:
   a. a circuit board including circuit components and having first and second edges;
   b. a first wiring board connected to the first edge of the circuit board, the first wiring board including first and second concentric conductors in electrical contact with the components;
   c. wherein the first and second conductors include planar surfaces, the surfaces being orthogonal to the circuit board; and
   d. a second wiring board connected to the second edge of the circuit board, the second wiring board including third and fourth conductors in electrical contact with the components.

* * * * *